United States Patent
Shimada

(10) Patent No.: US 10,704,748 B2
(45) Date of Patent: Jul. 7, 2020

(54) LIGHT MODULE AND PRODUCTION METHOD THEREFOR

(71) Applicant: Mitsubishi Electric Corporation, Tokyo (JP)

(72) Inventor: Masaaki Shimada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/473,431

(22) PCT Filed: May 17, 2017

(86) PCT No.: PCT/JP2017/018568
§ 371 (c)(1),
(2) Date: Jun. 25, 2019

(87) PCT Pub. No.: WO2018/211636
PCT Pub. Date: Nov. 22, 2018

(65) Prior Publication Data
US 2020/0149692 A1 May 14, 2020

(51) Int. Cl.
*F21V 23/00* (2015.01)
*F21S 4/22* (2016.01)
*F21Y 107/70* (2016.01)

(52) U.S. Cl.
CPC .............. *F21S 4/22* (2016.01); *F21V 23/002* (2013.01); *F21Y 2107/70* (2016.08)

(58) Field of Classification Search
CPC ........ F21S 4/22; F21V 23/002; F21Y 2107/70
See application file for complete search history.

(56) References Cited

U.S. PATENT DOCUMENTS

| 9,692,203 B2* | 6/2017 | Noguchi | H01S 5/02276 |
| 2010/0006863 A1* | 1/2010 | Ban | H01L 31/0203 257/81 |
| 2016/0006210 A1* | 1/2016 | Noguchi | H01L 31/0203 438/26 |

FOREIGN PATENT DOCUMENTS

| JP | 5720199 B2 | 5/2015 |
| JP | 2016-018862 A | 2/2016 |

OTHER PUBLICATIONS

International Search Report; Written Opinion; and Notification of Transmittal of the International Search Report and the Written Opinion of the International Searching Authority, or the Declaration issued in PCT/JP2017/018568; dated Jun. 20, 2017.

* cited by examiner

*Primary Examiner* — Anne M Hines
(74) *Attorney, Agent, or Firm* — Studebaker & Brackett PC

(57) ABSTRACT

A light module includes a module main body and a flexible substrate. The module main body has a stem, and a high frequency lead and a DC lead. The flexible substrate has a stem contact portion in contact with the lower surface of the stem. A high frequency through-hole and a DC through-hole are formed in the stem contact portion in which the high frequency lead and the DC lead are respectively inserted. The flexible substrate includes plural surface wirings, a ground wiring provided in a first region which contains the high frequency through-hole, but does not contain the DC through-hole on the back surface of the stem contact portion, and an adhesive layer provided in a second region which is a region excluding the first region on the back surface of the stem contact portion.

5 Claims, 8 Drawing Sheets

LIGHT MODULE AND PRODUCTION METHOD THEREFOR

FIELD

The present invention relates to a light module and a production method therefor.

BACKGROUND

Conventionally, a light module in which a flexible substrate is fixed to a stem of a module main body has been known as disclosed in JP 2016-18862 A. Hereinafter, the flexible substrate is also referred to as "Flexible Printed Circuit (FPC)".

CITATION LIST

Patent Literature

[PTL 1] JP 2016-18862 A

SUMMARY

Technical Problem

Plural through-holes and plural wirings extending to the through-holes are provided on the surface of an FPC. A ground wiring is provided on the back surface of the FPC. Of the plural wirings, a transmission line is formed by a high frequency wiring and a ground wiring. The stem and the FPC are assembled as follows. First, the back surface of the FPC is placed on the stem of the module main body, and leads of the module main body are inserted into the through-holes of the FPC. The placement of the back surface of the FPC on the stem causes the ground wiring to come into contact with the stem. Next, the leads are soldered to the wirings of the FPC with the leads being inserted in the through-holes.

If a gap is created between the ground wiring and the stem when the FPC is inclined or the like, there may be contact failure of the ground wiring, and thus deterioration of high frequency characteristics. In order to prevent the inclination of the FPC, it may be conceivable to temporarily fix the flexible substrate to the module main body by an adhesive layer such as double-sided tape. However, such a simple temporary fixing approach using an adhesive layer such as double-sided tape has a drawback. When an adhesive layer such as double-sided tape is interposed between the ground wiring and the stem, a minute gap remains between the ground wiring and the stem due to the thickness of the adhesive layer. There has been still a problem of deterioration of the high frequency characteristics due to this minute gap.

An object of the present invention, which has been made to solve the problem as described above, is to provide a light module capable of suppressing contact failure between a stem and a ground wiring and a production method therefor.

Solution to Problem

A light module according one aspect of the present invention includes: a module main body; and a flexible substrate. The module main body includes a stem having an upper surface and a lower surface, a plurality of optical semiconductor elements provided on an upper surface side of the stem, and a high frequency lead and a DC lead that penetrate the upper surface and the lower surface of the stem and are connected to the plurality of optical semiconductor elements. The flexible substrate includes a stem contact portion in contact with the lower surface of the stem. The stem contact portion has a back surface in contact with the lower surface and a front surface opposite to the back surface. A high frequency through-hole and a DC through-hole that penetrate the front surface and the back surface and in which the high frequency lead and the DC lead are inserted are formed in the stem contact portion. The flexible substrate further includes a plurality of surface wirings that are provided on the front surface and extend to the high frequency through-hole and the DC through-hole, a back surface ground wiring provided in a first region that contains the high frequency through-hole, but does not contain the DC through-hole on the back surface of the stem contact portion, and a back surface adhesive layer provided in a second region that is a region excluding the first region on the back surface of the stem contact portion. The back-surface ground wiring and the back surface adhesive layer are in contact with the lower surface of the stem. The high frequency lead and the DC lead are soldered to the plurality of surface wirings on the front surface.

A method of producing a light module according to other aspect of the present invention includes: a step of preparing a module main body; and a step of preparing a flexible substrate. The module main body includes a stem having an upper surface and a lower surface, a plurality of optical semiconductor elements provided on an upper surface side of the stem, and a high frequency lead and a DC lead that penetrate the upper surface and the lower surface of the stem and are connected to the plurality of optical semiconductor elements. The flexible substrate includes a stem contact portion in contact with the lower surface of the stem. The the stem contact portion has a back surface in contact with the lower surface and a front surface opposite to the back surface. A high frequency through-hole and a DC through-hole that penetrate the front surface and the back surface are formed in the stem contact portion. The flexible substrate further includes a plurality of surface wirings that are provided on the front surface and extend to the high frequency through-hole and the DC through-hole, a back surface ground wiring provided in a first region that contains the high frequency through-hole, but does not contain the DC through-hole on the back surface of the stem contact portion, and a back surface adhesive layer provided in a second region that is a region excluding the first region on the back surface of the stem contact portion. The method of producing a light module further includes: a step of placing the back surface of the flexible substrate on the lower surface of the stem to insert the high frequency lead into the high frequency through-hole, insert the DC lead into the DC through-hole, and bringing the back surface ground wiring and the back surface adhesive layer into contact with the lower surface of the stem; and a step of soldering the high frequency lead and the DC lead to the plurality of surface wirings on the front surface in a state where the high frequency lead is inserted in the high frequency through-hole and the DC lead is inserted in the DC through-hole.

Advantageous Effect of Invention

According to the present invention, the back-surface ground wiring is provided in the first region including the periphery of the high frequency through-holes which directly contributes to the high frequency characteristics, and the back-surface adhesion layer is provided in the remaining space other than the first region. By adjusting the thicknesses of the back-surface ground wiring and the back surface adhesive layer to the same degree, it is possible to temporarily fix the stem and the flexible substrate while suppressing the gap between the stem and the back-surface ground wiring. By temporary fixing, it is possible to avoid soldering in a contact-failure state between the stem and the back-surface ground wiring.

DESCRIPTION OF EMBODIMENT

Figure 1:
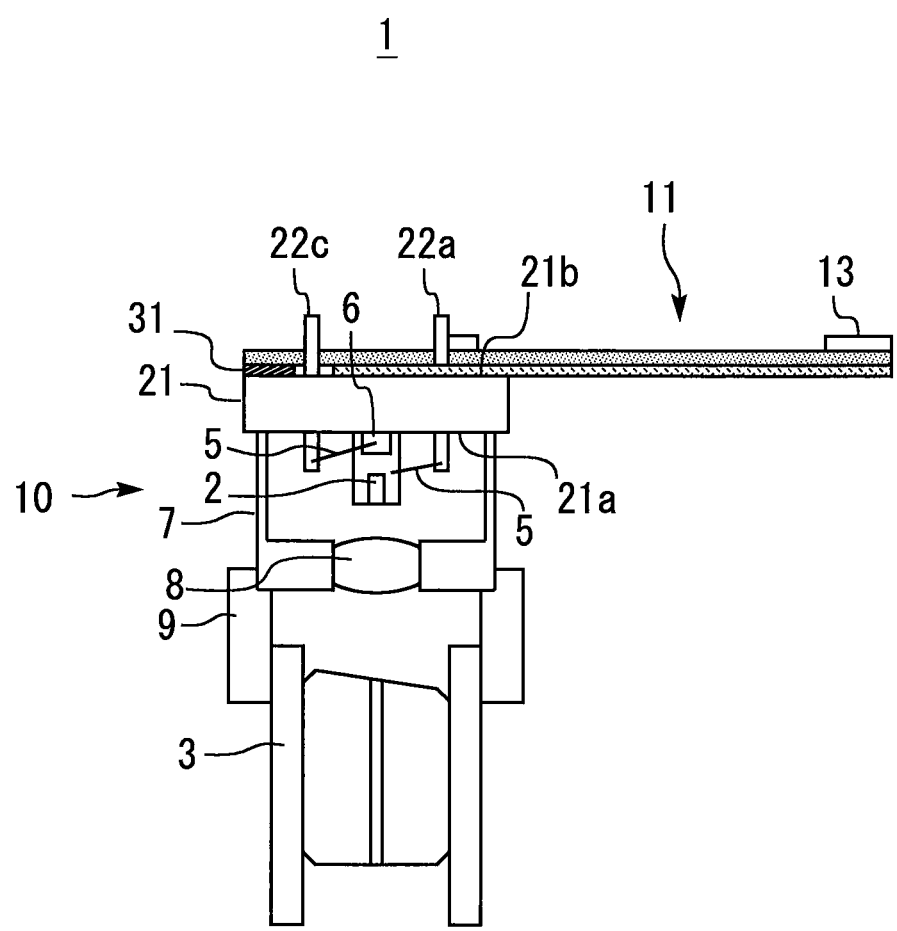
FIG. 1 is a diagram showing a light module according to an embodiment of the present invention.
Figure 2:
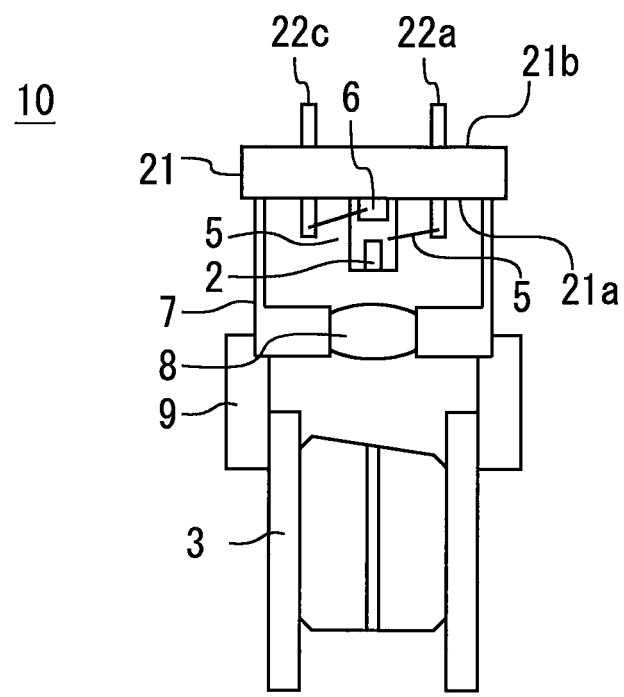
FIG. 2 is a diagram showing the module main body according to the embodiment of the present invention.
Figure 3:
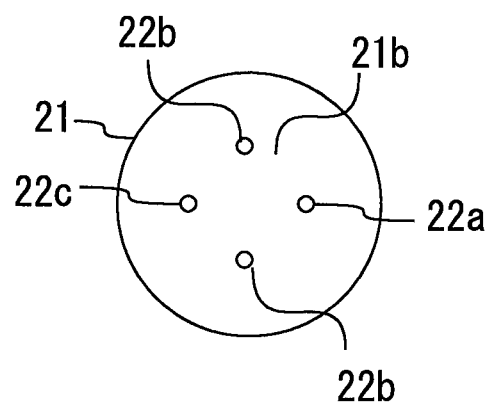
FIG. 3 is a diagram showing the module main body according to the embodiment of the present invention.

FIG. 1 is a diagram showing a light module 1 according to an embodiment of the present invention. The light module 1 includes a module main body 10 and a flexible substrate 11. FIGS. 2 and 3 are diagrams showing the module main body 10 according to the embodiment of the present invention. As shown in FIG. 2, the module main body 10 includes a stem 21 having an upper surface 21a and a lower surface 21b. A laser diode 2 and a monitor photodiode 6 are provided on the upper surface 21a side of the stem 21. FIG. 3 is a plan view of the lower surface 21b of the stem 21. The stem 21 is provided with plural leads 22a to 22c penetrating through the upper surface 21a and the lower surface 21b of the stem 21. The plural leads 22a to 22c are a ground lead 22a, a high frequency lead 22b, and a DC lead 22c.

As shown in FIG. 2, the module main body 10 is a coaxial type CAN package module. The module main body 10 is a light module for transmission. In the module main body 10, a laser diode 2 converts an electrical signal into an optical signal or vice versa. The ground lead 22a penetrates through the stem 21, and the ground lead 22a and a metal block provided on the upper surface 21a of the stem 21 are connected to each other by a wire 5. A ground potential is applied to the stem 21. As shown in FIG. 3, the high frequency lead 22b penetrates through the stem 21, and the high frequency lead 22b and the laser diode 2 are connected to each other by a wire (not shown). The monitor photodiode 6 is arranged on the back surface of the laser diode 2. The monitor photodiode 6 and the DC lead 22c are connected to each other by the wire 5. A lens 8 is arranged so as to face an emission end face of the laser diode 2 by a lens cap 7. A receptacle 3 is arranged so as to face the lens 8 by a receptacle fixing holder 9.

Figure 4:
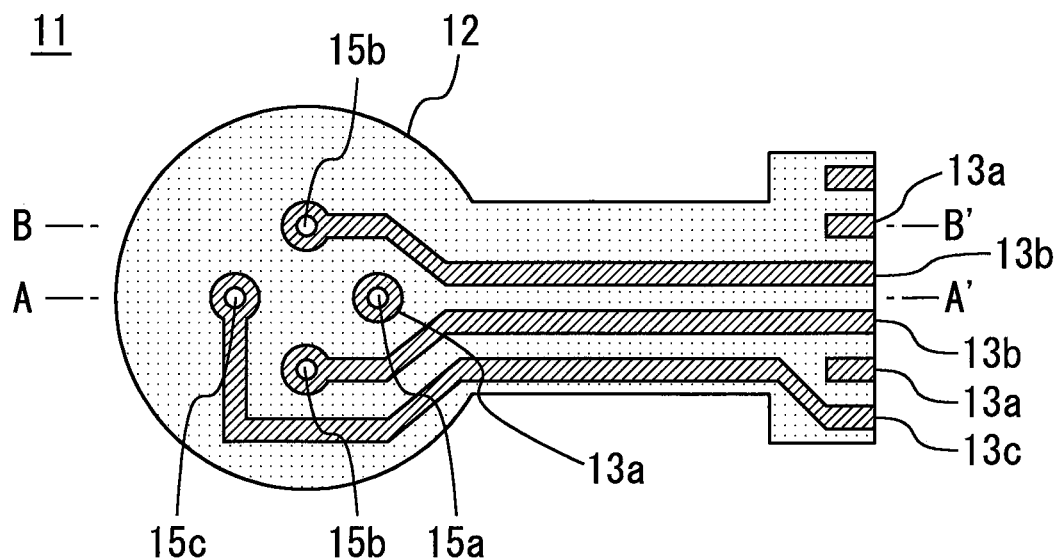
FIG. 4 is a diagram showing a surface of the flexible substrate according to the embodiment of the present invention.
Figure 5:
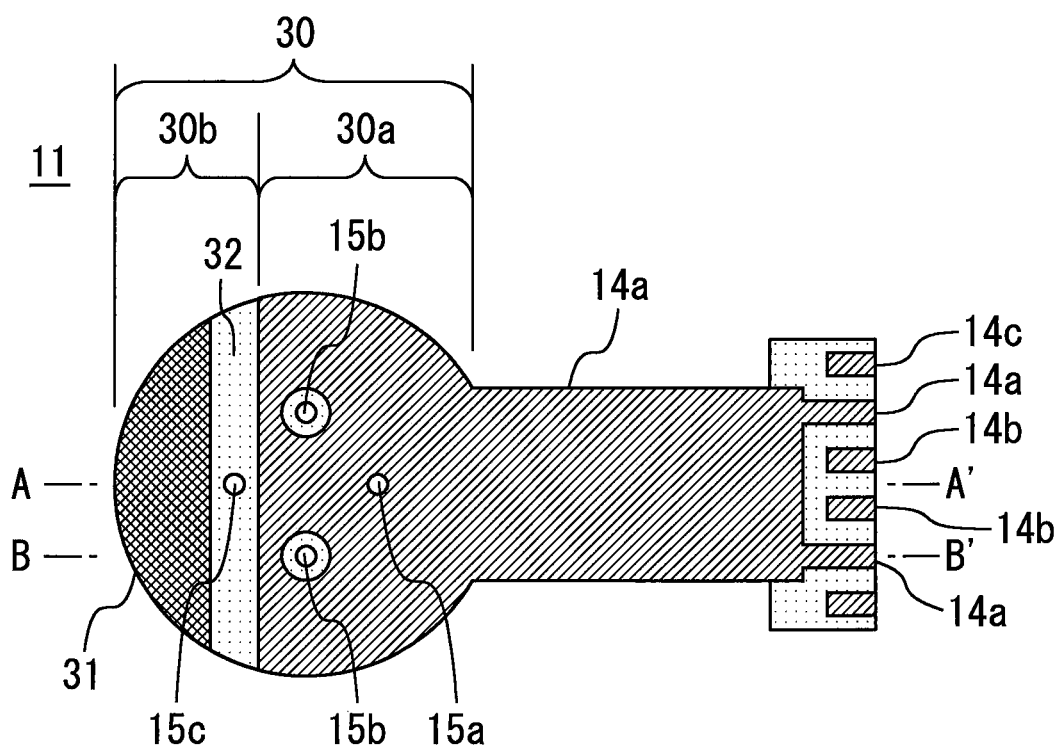
FIG. 5 is a diagram showing a back surface of the flexible substrate according to the embodiment of the present invention.
Figure 6:
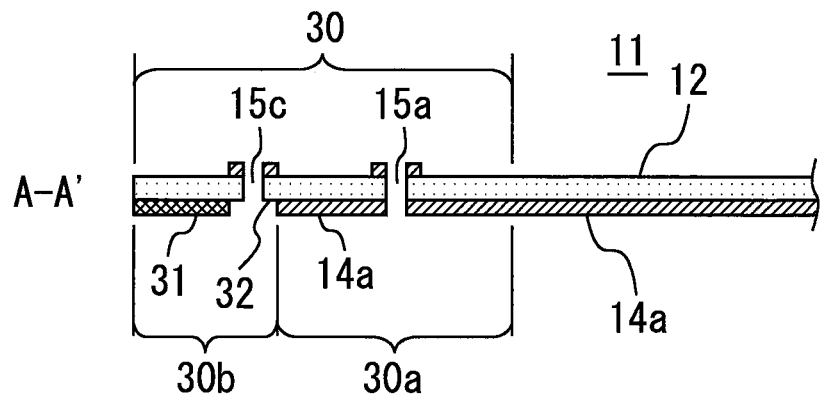
FIG. 6 is a cross-sectional view taken along a line A-A' of the flexible substrate according to the embodiment of the present invention.
Figure 7:
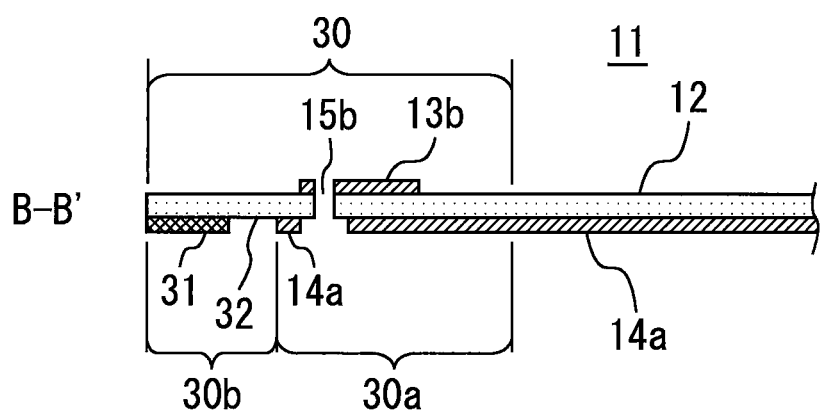
FIG. 7 is a cross-sectional view taken along a line B-B' of the flexible substrate according to the embodiment of the present invention.

Next, the structure of the flexible substrate 11 will be described with reference to FIGS. 4 to 7. FIG. 4 is a diagram showing a surface of the flexible substrate 11 according to the embodiment of the present invention. FIG. 5 is a diagram showing a back surface of the flexible substrate 11 according to the embodiment of the present invention. FIG. 6 is a cross-sectional view taken along a line A-A' of the flexible substrate 11 according to the embodiment of the present invention. FIG. 7 is a cross-sectional view taken along a line B-B' of the flexible substrate 11 according to the embodiment of the present invention. The flexible substrate 11 is adapted to connect an external circuit board (not shown) and the module main body 10.

The flexible substrate 11 includes a dielectric material 12, plural surface wirings 13a to 13c provided on the surface of the dielectric material 12, and plural back surface wirings 14a to 14c and a back surface adhesive layer 31 which are provided on the back surface of the dielectric material 12. The dielectric material 12 is made of, for example, polyimide, liquid crystal polymer or the like. The plural surface wirings 13a to 13c and the plural back surface wirings 14a to 14c are formed of metal such copper foil. The flexible substrate 11 has a stem contact portion 30. The stem contact portion 30 is a portion of the flexible substrate 11 which is in contact with the lower surface 21b of the stem 21. A ground through-hole 15a, high frequency through-holes 15b, and a DC through-hole 15c which penetrate the front surface and the back surface are formed in the stem contact portion 30.

As shown in FIG. 4, plural surface wirings 13a to 13c are provided on the surface of the flexible substrate 11. The plural surface wirings 13a to 13c include surface ground wirings 13a, surface high frequency wirings 13b extending to the high frequency through-holes 15b, and a surface DC wiring 13c extending to the DC through-hole 15c.

As shown in FIG. 5, plural back surface wirings 14a to 14c are provided on the back surface of the flexible substrate 11. The plural of back surface wirings 14a to 14c include a back-surface ground wiring 14a, back surface high frequency wirings 14b, and a back-surface DC wiring 14c. The surface high frequency wirings 13b and the back-surface ground wiring 14a form a transmission line such as a microstrip line, and are impedance-adjusted so as to be capable of transmitting high frequency signals.

As shown in FIG. 5, the back surface of the stem contact portion 30 is demarcated into a first region 30a and a second region 30b. The first region 30a is a region which contains the high frequency through-holes 15b, but does not contain the DC through-hole 15c on the back surface of the stem contact portion 30. The first region 30a is provided with the back-surface ground wiring 14a. The high frequency leads 22b are inserted into the high frequency through-holes 15b (see FIG. 9). The back-surface ground wiring 14a and the lower surface 21b of the stem 21 are in contact with each other around the high frequency leads 22b. A coaxial line is formed, and the impedance is adjusted. The first region 30a covers half or more of the stem contact portion 30. The second region 30b is a remaining space of the back surface of the stem contact portion 30 excluding the first region 30a. A back surface adhesive layer 31 is provided in the second region 30b. The back-surface ground wiring 14a and the back surface adhesive layer 31 have the same thickness. The back surface adhesive layer 31 is adapted to temporarily fix the flexible substrate 11 so that the flexible substrate 21 is not peeled off from the stem 21. The back surface adhesive layer 31 may be, for example, a double-sided tape. The back surface adhesive layer 31 may be obtained by coating adhesive agent or cohesive material onto the second region 30b. No specific limitation is imposed on the material of the back surface adhesive layer 31.

Note that in the embodiment, the back-surface ground wiring 14a and the back surface adhesive layer 31 are spaced from each other on the back surface of the stem contact portion 30. An exposed portion 32 in which the dielectric material 12 is exposed is provided at this spaced portion. The DC through-hole 15c is provided in the exposed portion 32. The back-surface ground wiring 14a and the back surface adhesive layer 31 are arranged to be spaced from each other, thereby eliminating the overlap between the back-surface ground wiring 14a and the back surface adhesive layer 31. The back surface adhesive layer 31 is also prevented from inadvertently blocking the DC through-hole 15c or reducing the diameter of the DC through-hole 15c.

Figure 8:
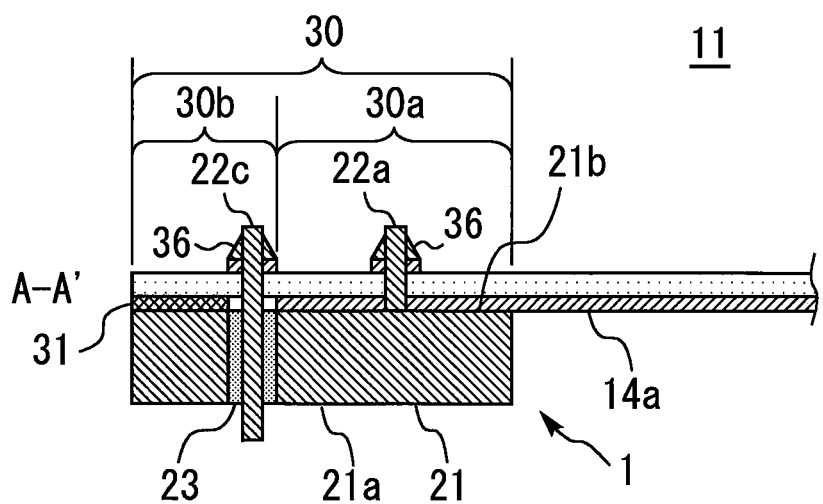
FIG. 8 is a cross-sectional view taken along a line A-A' which shows an assembled state of the stem and the flexible substrate according to the embodiment of the present invention.
Figure 9:
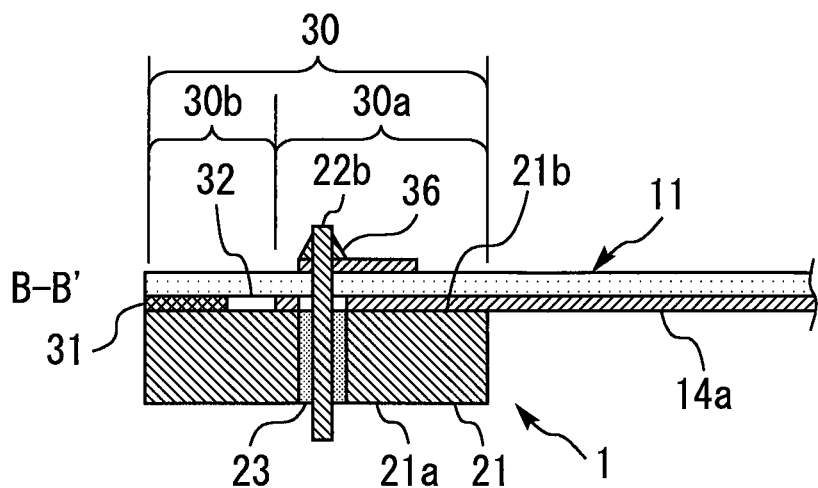
FIG. 9 is a cross-sectional view taken along a line B-B' which shows an assembled state of the stem and the flexible substrate according to the embodiment of the present invention.
Figure 10:
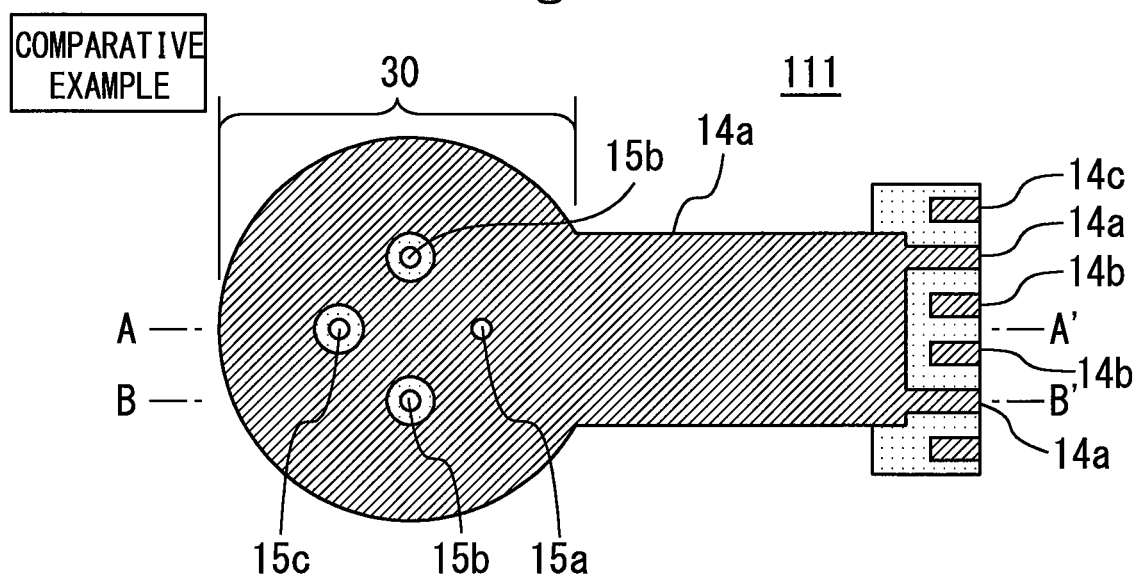
FIG. 10 is a diagram showing a comparative example to the embodiment.
Figure 11:
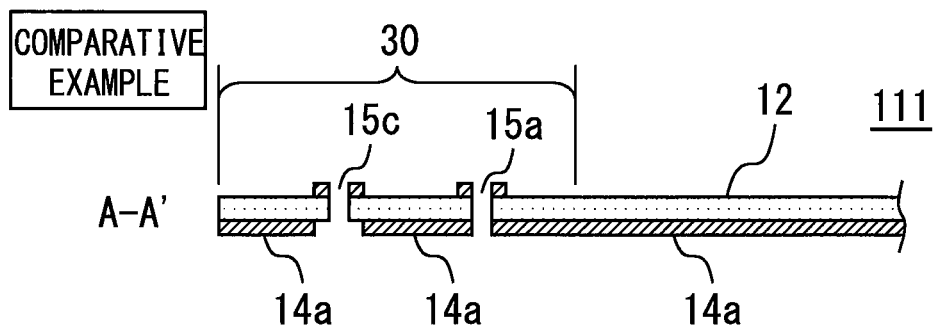
FIG. 11 is a diagram showing a comparative example to the embodiment.
Figure 12:
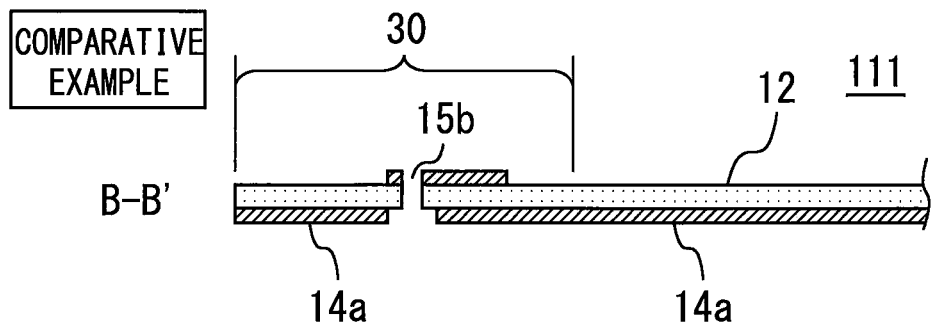
FIG. 12 is a diagram showing a comparative example to the embodiment.

FIG. 8 is a cross-sectional view taken along a line A-A' which shows an assembled state of the stem 21 and the flexible substrate 11 according to the embodiment of the present invention. FIG. 9 is a cross-sectional view taken along a line B-B' which shows an assembled state of the stem 21 and the flexible substrate 11 according to the embodiment of the present invention. FIGS. 8 and 9 illustrate the assembled state of the stem 21 and the flexible substrate 11 while components other than the stem 21 in the module main body 10 are omitted for the sake of convenience. The back surface of the stem contact portion 30 is in contact with the lower surface 21b of the stem 21, and the back-surface ground wiring 14a and the back surface adhesive layer 31 are in contact with the lower surface 21b of the stem 21. The ground lead 22a, the high frequency leads 22b and the DC lead 22c are inserted in the ground through-hole 15a, the high frequency through-holes 15b and the DC through-hole 15c, respectively. The ground lead 22a, the high frequency leads 22b, the DC lead 22c are soldered to the plural surface wirings 13a to 13c on the surface of the stem contact portion 30. The flexible substrate 11 is permanently fixed to the stem 21 by solder 36.

The two high frequency leads 22b and the DC lead 22c are insulated from the stem 21 by glass 23. The two high frequency leads 22b are connected to an anode and a cathode of the laser diode 2, respectively. The high frequency lead 22b is provided with a coaxial structure by the glass 23 and the stem 21. A peripheral structure of the high frequency lead 22b is impedance-adjusted so that a high frequency signal can be transmitted therethrough. The monitor photodiode 6 is adapted to monitor the light output power. The DC lead 22c is adapted to apply a drive voltage to the monitor photodiode 6, and no high frequency signal is input to the DC lead 22c. Therefore, the DC lead 22c does not need high frequency characteristics. Therefore, the back-surface ground wiring 14a is not provided around the DC through-hole 15c.

By adjusting the thicknesses of the back-surface ground wiring 14a and the back surface adhesive layer 31 to the same degree, the stem 21 and the flexible substrate 11 can be temporarily fixed while suppressing the gap between the stem 21 and the back-surface ground wiring 14a. The temporary fixing makes it possible to avoid soldering in a contact-failure state between the stem 21 and the back-surface ground wiring 14a.

Figure 16:
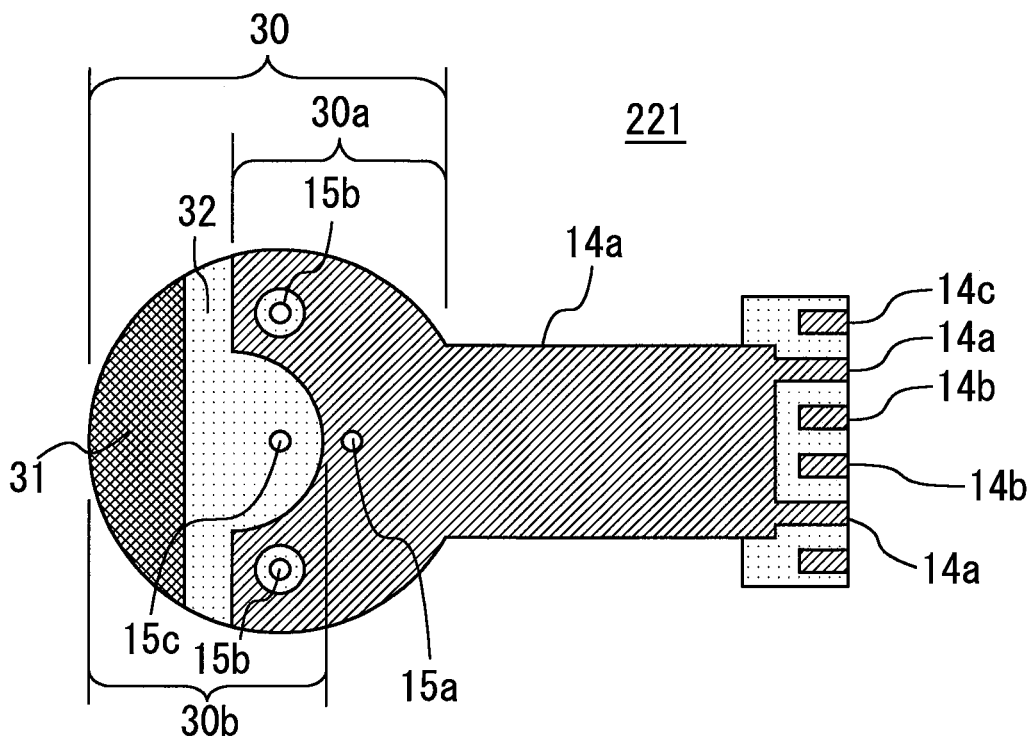
FIG. 16 is a diagram showing modifications of the light module according to the embodiment of the present invention.
Figure 17:
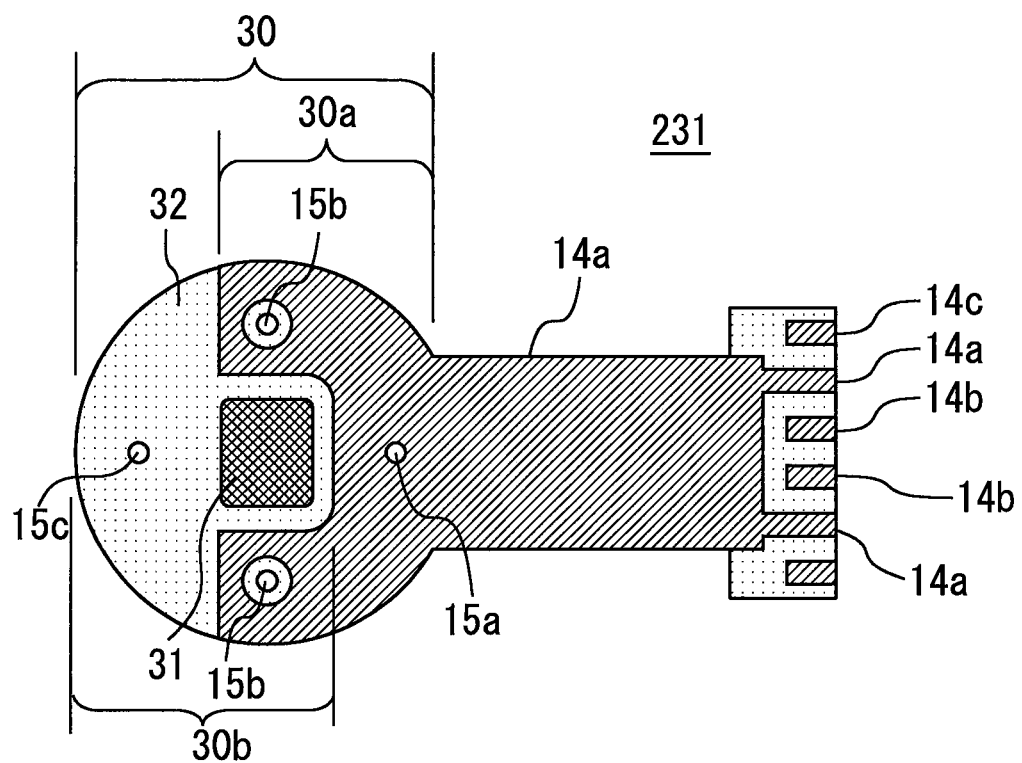
FIG. 17 is a diagram showing modifications of the light module according to the embodiment of the present invention.

FIGS. 16 and 17 are diagrams showing modifications of the light module 1 according to the embodiment of the present invention. Flexible substrates 221 and 231 shown in FIGS. 16 and 17 may be connected to the module main body 10 instead of the flexible substrate 11 to form the light module 1. In the case of the flexible substrate 221 of FIG. 16, a first region 30a is concaved so that the back-surface ground wiring 14a is not provided in a center region of the stem contact portion 30, and the DC through-hole 15c is arranged in the center region of the stem contact portion 30. In the case of the flexible substrate 231 of FIG. 17, the first region 30a is concaved so that the back-surface ground wiring 14a is not provided in the center region of the stem contact portion 30, and the back surface adhesive layer 31 is arranged at the center of the stem contact portion 30. Note that although not shown, the position of the DC lead 22c may be replaced with any of the positions of the ground lead 22a and the two high frequency leads 22b. In connection with the change of the position of the DC lead 22c, the first region 30a where the back-surface ground wiring 14a is provided may be deformed, whereby the position where the back surface adhesive layer 31 is provided can be changed.

In the embodiment, the light module 1 includes two optical semiconductor elements such as the laser diode 2 and the monitor photodiode 6, but these optical semiconductor elements may be changed. For example, instead of or in addition to the monitor photodiode 6, the laser diode 2 and an electroabsorption type modulator may be mounted in the light module 1. In this modification, a DC drive current is supplied to the laser diode 2 via the DC lead 22c, and a high frequency modulation signal is supplied to the electroabsorption type modulator via the high frequency leads 22b. Note that the two optical semiconductor elements of the laser diode 2 and the electroabsorption type optical modulator may be integrated in one chip in the form of a monolithic electroabsorption type optical modulation laser chip.

Figure 13:
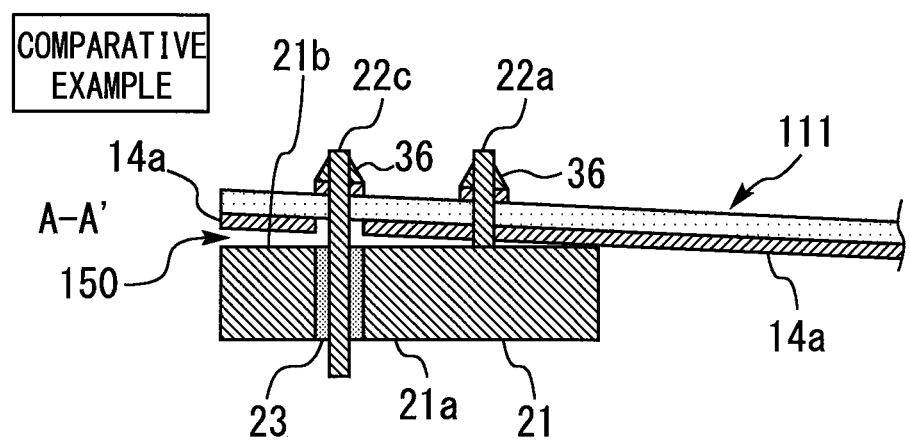
FIG. 13 is a diagram showing a comparative example to the embodiment.
Figure 14:
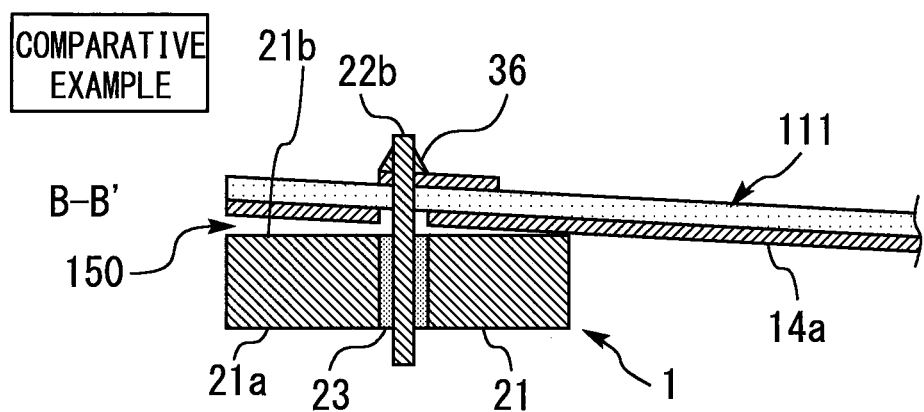
FIG. 14 is a diagram showing a comparative example to the embodiment.

FIGS. 10 to 14 are diagrams showing a comparative example to the embodiment. In a flexible substrate 111 of the comparative example shown in FIGS. 10 to 12, the back-surface ground wiring 14a is provided on the entire back surface of the flexible substrate 111, and the back surface adhesive layer 31 is not provided. The flexible substrate 111 extends in one direction from a first edge portion of the stem contact portion 30, which leads to unbalanced weight. As a result, as shown in FIGS. 13 and 14, there is a risk that the flexible substrate 111 may be inclined with an end portion of the stem 21 as a fulcrum when the flexible substrate 111 is mounted on the module main body 10. This inclination causes formation of a gap 150 between the lower surface 21b of the stem 21 and the flexible substrate 111. If the flexible substrate 111 is soldered while being inclined, the connection between the stem 21 and the back-surface ground wiring 14a becomes insufficient. As a result, when the coaxial structure of the high-frequency leads 22b is broken, impedance mismatching occurs, which causes problems that the high-frequency characteristics deteriorate, high-speed signals cannot be transmitted, etc.

In this respect, in the flexible substrate 11 according to the embodiment, the configuration that the flexible substrate 11 extends in one direction from the first edge portion of the stem contact portion 30 is the same as the comparative example, but the back surface adhesive layer 31 is provided at a second edge portion opposite to the first edge portion of the stem contact portion 30. As a result, even in a structure where the flexible substrate 11 extends in one direction and thus has unbalanced weight, sufficient temporary fixing can be performed.

Figure 15:
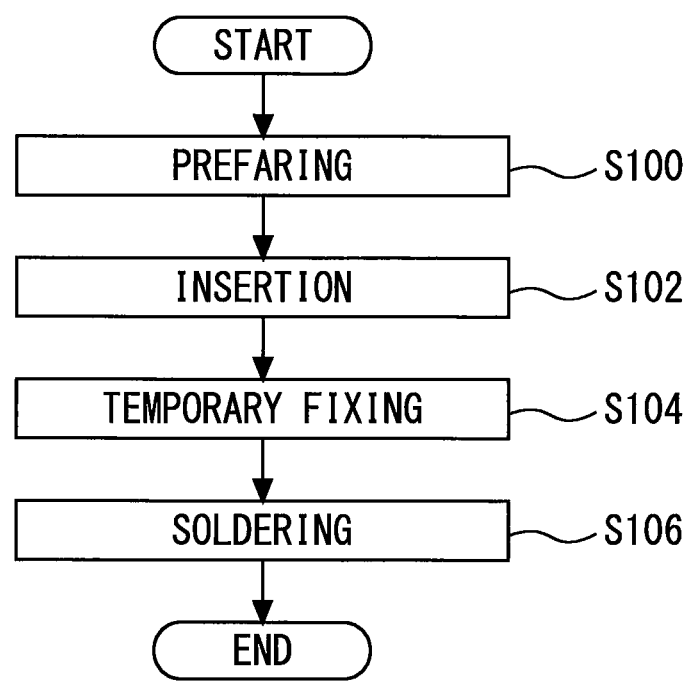
FIG. 15 is a flowchart showing a method of producing the light module according to the embodiment of the present invention.

FIG. 15 is a flowchart showing a method of producing the light module 1 according to the embodiment of the present invention. In the flowchart of FIG. 15, a step of preparing the module main body 10 and the flexible substrate 11 described above is first performed (step S100).

Next, an insertion step is performed (step S102). By placing the back surface of the flexible substrate 11 on the lower surface 21b of the stem 21, the ground lead 22a is inserted in the ground through-hole 15a, the high frequency leads 22b are inserted in the high frequency through-holes 15b, and the DC lead 22c is inserted in the DC through-hole 15c.

Next, temporary fixing is performed (step S104). The back surface adhesive layer 31 implements the temporary fixing by bringing the back-surface ground wiring 14a and the back surface adhesive layer 31 into contact with the lower surface 21b of the stem 21.

Next, soldering is performed (step S106). The ground leads 22a to the DC lead 22c and the plural surface wirings 13a to 13c are soldered while the ground leads 22a to the DC lead 22c are inserted in the ground through-holes 15a to DC through-hole 15c, respectively. The flexible substrate 11 is permanently fixed to the stem 21 by the solder 36. By the temporary fixing, it is possible to avoid permanent fixing in a contact-failure state between the stem 21 and the back-surface ground wiring 14a.

REFERENCE SIGNS LIST 1 light module
2 laser diode
3 receptacle
5 wire
6 monitor photodiode
7 lens cap
8 lens
9 receptacle fixing holder
10 module main body
11, 111, 221, 231 flexible substrate
12 dielectric material
13a surface wiring (surface ground wiring)
13b surface wiring (surface high frequency wiring)
13c surface wiring (surface DC wiring)
14a back surface wiring (back surface ground wiring)
14b back surface wiring (back surface high frequency wiring)
14c back surface wiring (back surface DC wiring)
15a ground through-hole
15b high frequency through-hole
15c DC through-hole
21 stem
21a upper surface
21b lower surface
22a lead (ground lead)
22b lead (high frequency lead)
22c lead (DC lead)
23 glass
30 stem contact portion
30a first region
30b second region
31 back surface adhesive layer
32 exposed portion
36 solder
150 gap

The invention claimed is:

1. A light module comprising:
a module main body including a stem having an upper surface and a lower surface, a plurality of optical semiconductor elements provided on an upper surface side of the stem, and a high frequency lead and a DC lead that penetrate the upper surface and the lower surface of the stem and are connected to the plurality of optical semiconductor elements; and
a flexible substrate including a stem contact portion in contact with the lower surface of the stem, wherein the stem contact portion has a back surface in contact with the lower surface and a front surface opposite to the back surface, a high frequency through-hole that penetrates the front surface and the back surface and in which the high frequency lead is inserted is formed in the stem contact portion, a DC through-hole that penetrates the front surface and the back surface and in which the DC lead is inserted is formed in the stem contact portion, and the flexible substrate further includes a plurality of surface wirings that are provided on the front surface and extend to the high frequency through-hole and the DC through-hole, a back surface ground wiring provided in a first region that contains the high frequency through-hole, but does not contain the DC through-hole on the back surface of the stem contact portion, and a back surface adhesive layer provided in a second region that is a region excluding the first region on the back surface of the stem contact portion, and
wherein the back-surface ground wiring and the back surface adhesive layer are in contact with the lower surface of the stem, and the high frequency lead and the DC lead are soldered to the plurality of surface wirings on the front surface.

2. The light module according to claim 1, wherein the back-surface ground wiring and the back surface adhesive layer are spaced from each other on the back surface, and the DC through-hole is provided between the back-surface ground wiring and the back surface adhesive layer on the back surface.

3. The light module according to claim 1, wherein the flexible substrate extends from a first edge portion of the stem contact portion, and the back surface adhesive layer is provided at a second edge portion opposite to the first edge portion of the stem contact portion.

4. The light module according to claim 2, wherein the flexible substrate extends from a first edge portion of the stem contact portion, and the back surface adhesive layer is provided at a second edge portion opposite to the first edge portion of the stem contact portion.

5. A method of producing a light module comprising:
- a step of preparing a module main body including a stem having an upper surface and a lower surface, a plurality of optical semiconductor elements provided on an upper surface side of the stem, and a high frequency lead and a DC lead that penetrate the upper surface and the lower surface of the stem and are connected to the plurality of optical semiconductor elements;
- a step of preparing a flexible substrate including a stem contact portion in contact with the lower surface of the stem, wherein the stem contact portion has a back surface in contact with the lower surface and a front surface opposite to the back surface, a high frequency through-hole and a DC through-hole that penetrate the front surface and the back surface are formed in the stem contact portion, and the flexible substrate further includes a plurality of surface wirings that are provided on the front surface and extend to the high frequency through-hole and the DC through-hole, a back surface ground wiring provided in a first region that contains the high frequency through-hole, but does not contain the DC through-hole on the back surface of the stem contact portion, and a back surface adhesive layer provided in a second region that is a region excluding the first region on the back surface of the stem contact portion;
- a step of placing the back surface of the flexible substrate on the lower surface of the stem to insert the high frequency lead into the high frequency through-hole, insert the DC lead into the DC through-hole, and bringing the back surface ground wiring and the back surface adhesive layer into contact with the lower surface of the stem; and
- a step of soldering the high frequency lead and the DC lead to the plurality of surface wirings on the front surface in a state where the high frequency lead is inserted in the high frequency through-hole and the DC lead is inserted in the DC through-hole.

* * * * *